(12) United States Patent
Yamaguchi et al.

(10) Patent No.: US 6,710,850 B2
(45) Date of Patent: Mar. 23, 2004

(54) EXPOSURE APPARATUS AND EXPOSURE METHOD

(75) Inventors: Atsushi Yamaguchi, Tokyo (JP); Hideaki Sakamoto, Tokyo (JP); Yasuhiro Honda, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/022,228

(22) Filed: Dec. 20, 2001

(65) Prior Publication Data

US 2002/0109824 A1 Aug. 15, 2002

(30) Foreign Application Priority Data

Dec. 22, 2000 (JP) ........................ 2000-390183
Dec. 20, 2001 (JP) ........................ 2001-388574

(51) Int. Cl.⁷ .......................... G03B 27/42; G03B 27/58
(52) U.S. Cl. .......................................... 355/53; 355/72
(58) Field of Search ................ 355/53, 67, 72–76; 318/625; 250/548; 356/399–401

(56) References Cited

U.S. PATENT DOCUMENTS

| | | | | | |
|---|---|---|---|---|---|
| 5,753,926 | A | * | 5/1998 | Sato ........................... | 250/548 |
| 5,900,707 | A | * | 5/1999 | Wakui ........................ | 318/625 |
| 6,259,511 | B1 | * | 7/2001 | Makinouchi et al. ......... | 355/53 |
| 6,359,688 | B2 | * | 3/2002 | Akimoto et al. ............ | 356/201 |
| 6,426,788 | B1 | * | 7/2002 | Korenaga .................... | 355/53 |

FOREIGN PATENT DOCUMENTS

JP          408124843          * 5/1996

* cited by examiner

Primary Examiner—Henry Hung Nguyen
(74) Attorney, Agent, or Firm—Oliff & Berridge, PLC

(57) ABSTRACT

A reticle stage moves while holding the reticle. A stage controller detects the acceleration of the reticle stage based on the results of detection of an laser interference system. A main control system controls movement of the reticle stage so that the acceleration detected by the reticle stage becomes within a predetermined range of acceleration of the reticle stage where offset will not occur in the reticle. An image of the pattern formed on the reticle is transferred to a wafer through a projection optical system while synchronously moving the reticle and the wafer.

26 Claims, 7 Drawing Sheets

EXPOSURE APPARATUS AND EXPOSURE METHOD

BACKGROUND OF THE INVENTION

1. Field of the Invention

The present invention relates to an exposure apparatus and exposure method used when producing a semiconductor integrated circuit, a liquid crystal display, a pickup device, a thin film magnetic head, or another device, more particularly relates to an exposure apparatus and exposure method for exposing an image of a pattern formed on a mask on to a substrate while making the mask and substrate engage in a synchronous scan motion.

2. Description of the Related Art

In the production of a semiconductor circuit, liquid crystal display, pickup element, thin film magnetic head, or other device, the image of a fine pattern formed on a photomask or reticle (hereinafter referred to as a "mask" when spoken of in general) is repeatedly transferred using an exposure apparatus through a projection optical system to a semiconductor wafer or glass plate etc. coated with a photoresist or other photosensitive agent.

In the production of a semiconductor circuit, use is made of a step-and-repeat type reduction projection exposure apparatus (so-called "stepper") which places the substrate on a substrate stage able to freely move in two dimensions, repeatedly makes the substrate move in steps by this substrate stage, and successively exposes and transfers the image of the pattern of the reticle on to shot areas of the substrate.

In recent years, along with the increasingly large size of substrates and increasing fineness of patterns, a step-and-scan type exposure apparatus which transfers the image of a pattern formed on a reticle to a substrate while making the substrate stage carrying the substrate and a reticle stage carrying the reticle formed with the pattern to be exposed move synchronously has come into use.

Even with exposure using the step-and-scan type exposure apparatus, like with the stepper, the photoresist or other photosensitive agent is repeatedly coated on a substrate already formed with a pattern so as to expose different patterns. Therefore, it is necessary to measure the relative position of the substrate and the pattern formed on the reticle to be projected with a high accuracy and to precisely match the relative positions of the substrate and reticle at the time of exposure. In particular, in the step-and-scan type exposure apparatus, it is necessary to accurately control the relative positions and scan speeds of the reticle and substrate at the time of start of exposure.

In the production of the device, however, in order to reduce the manufacturing costs etc., it is required to increase the number of substrates which can be processed by the exposure apparatus in a unit time (throughput). The above step-and-scan type exposure apparatus performs exposure while making the reticle and substrate engage in synchronous scan motion, but to improve the throughput, it is necessary to increase the scan speeds of the reticle stage and substrate stage at the time of exposure.

The step-and-scan type exposure apparatus moves the reticle stage and substrate stage by a constant speed at the time of exposure, so at the time of start of the scan, it is necessary to make the reticle stage and substrate stage accelerate from the stationary state to the constant scan speed, while at the time of end of the scan, it is necessary to decelerate the reticle stage and substrate stage moving at the constant scan speed to make them stop. Improvement of the throughput requires the scan speed of the reticle stage and substrate stage to be raised, but if the scan speed is raised, the acceleration at the time of acceleration or deceleration of the reticle stage also has to be made higher. Further, after the end of scan exposure of one shot area on the substrate and before the scan exposure of the next shot area, movement of the substrate is controlled so as to start the movement of the substrate in the nonscan direction perpendicular to the scan direction before the speed component relating to the scan direction in which the substrate is moved at the time of scan exposure becomes zero (stepping action) and to start the acceleration of the substrate in the scan direction before the stepping action is completed, that is, before the speed component of the substrate relating to the nonscan direction becomes zero. Therefore, the time of movement of the substrate between shot areas is shortened, so shortening of the acceleration and deceleration periods of the reticle stage, that is, an increase of the acceleration, has been requested.

If a stage moves, the position at which the substrate or reticle etc. is carried may shift. To prevent this, in the step-and-scan type exposure apparatus, the reticle is held by suction on the reticle stage, while the substrate is held by suction on the substrate stage. Therefore, even if a certain degree of force is applied to the reticle or substrate in the scan direction or the opposite direction due to acceleration or deceleration, the position of the reticle on the reticle stage and the position of the substrate on the substrate stage will not shift.

If the acceleration is increased at the time of acceleration or deceleration of the reticle stage or substrate stage, however, the position of the reticle or substrate may shift even if held by suction. The substrate is held by suction on the substrate stage over substantially the entire bottom surface, so the suction force can be made relatively high, but the reticle is a synthetic quartz or other glass plate on one surface of which a pattern is formed and illumination light for exposure passing through the reticle is projected on to the substrate, so it is only possible to hold the periphery of the bottom surface of the reticle (pattern formation surface) on the reticle stage.

Further, when providing a reduction projection type projection optical system with a projection magnification of $1/\beta$ (where $\beta$ is for example 4, 5, 6, etc.), it is necessary to set the scan speed of the reticle stage to $\beta$-times the scan speed of the substrate stage. Therefore, the acceleration at the time of acceleration or deceleration of the reticle stage has to be set higher by that amount. If the reticle becomes offset, the image of the pattern formed on the reticle will be transferred to the substrate in a state with the relative positions of the reticle and substrate offset, so the device produced is liable to become a defective one which does not give the desired performance. In particular, when producing a device formed with a fine pattern, even a slight offset could lead to a defective product.

Further, in addition to the time of exposure of the substrate, for example, at the time of alignment or exchange of reticles or moving a reticle from the alignment position to an exposure position (position of start of acceleration), if the acceleration of the reticle stage is high, there is the problem that offset of the reticle will occur in the same way as above and the accuracy of alignment with the substrate will fall.

SUMMARY OF THE INVENTION

The present invention was made in consideration of this problem in the prior art and has as its object to enable exposure with a high throughput without allowing offset to occur along with movement of the mask. Further, it has as its object to enable exposure to stop being continued in a state of offset in the event that offset occurs along with movement of the mask.

To solve the above problem, according to a first aspect of the present invention, there is provided an exposure apparatus for exposing a substrate through a mask formed with a pattern, the exposure apparatus characterized by being provided with a stage which holds and moves the mask, an acceleration detection device which detects information relating to acceleration of the stage, and a control device which controls movement of the stage so that the acceleration of the stage as based on the information detected by the acceleration detection device becomes within a range of acceleration of the stage found in advance where offset will not occur in the mask.

According to the present invention, since movement of the stage is controlled so that the acceleration of the stage as based on the information detected by the acceleration detection device becomes within a range of acceleration of the stage where offset will not occur in the mask, offset of the mask is not caused at the time of exposure. Further, by making the stage move at a higher acceleration within the range where offset will not occur in the mask, it is possible to perform exposure with a high throughput without allowing offset to be caused along with movement of the mask stage.

To solve the above problem, according to a second aspect of the present invention, there is provided an exposure apparatus for exposing a substrate through a mask formed with a pattern, the exposure apparatus provided with a stage which holds and moves the mask, an acceleration detection device which detects information relating to acceleration of the stage, a posture detection device which detects a posture of the mask on the stage, and a control device which initiates detection by the posture detection device when the acceleration of the stage as based on the information detected by the acceleration detection device becomes out of the range of acceleration of the stage found in advance where offset will not occur in the mask and performs processing for notifying an operator of the fact that it has judged that offset has occurred in the mask when that is the case.

According to the present invention, when the acceleration of the stage as based on the information detected by the acceleration detection device becomes out of the range of acceleration where offset will not occur in the mask, the posture detection device is used to detect the posture of the mask. When offset of the mask is detected by the results of detection of the posture detection device, that fact is notified to the operator. Therefore, the exposure processing is not liable to continue while the offset of the mask remains and a defective product is not liable to be caused.

Further, the range of acceleration where offset of the mask will be caused is not clearly separated from the range of acceleration where offset of the mask will not be caused. For example, there is a range of acceleration where offset of the mask will sometimes occur and sometimes not occur even at the same acceleration depending on the temperature, humidity, and other surrounding conditions. To realize high throughput, requests may conceivably be made not to move the stage in the range where offset will never occur, but to increase the acceleration of the stage even if there is a possibility of movement of the mask. By application of the present invention, it is also possible to respond to such requests. Even if the acceleration is set too high and offset of the mask occurs, it is possible to prevent exposure processing from continuing while the offset remains.

In the exposure apparatus according to the second aspect of the invention, further provision is made of a posture adjustment device which adjusts the relative positional relationship between the mask on the stage and the substrate (for example, the posture of the mask or substrate etc.) and the relative positional relationship of the mask and substrate is made adjustable so as to cancel out offset by the posture adjustment device when the control device judges that offset has occurred in the mask. When judging that offset has occurred in the mask, the control device adjusts the relative positional relationship between the mask and substrate by the posture adjustment device so as to cancel out the offset, so even if offset of the mask occurs, that deviation is automatically corrected. This is desirable in obtaining a high throughput.

In the exposure apparatuses of the first aspect and second aspect of the invention, the range of acceleration can be derived by a process of trial and error by repeatedly detecting offset of the mask while increasing or decreasing the acceleration of the stage in steps.

In the exposure apparatuses of the first aspect and second aspect of the invention, the range of acceleration is derived at least at one of the time of startup of the exposure apparatus and the time of exchange of the mask.

In the exposure apparatuses of the first aspect and second aspect of the invention, it is possible to further provide a storage device which stores the range of acceleration of the stage.

In the exposure apparatuses of the first aspect and second aspect of the invention, it is possible to further provide a sensor which detects information relating to an ability of the stage to hold the mask and to change the range of acceleration by the control device in accordance with the detected information. As the sensor in this case, it is possible to employ a vacuum sensor etc. for measuring the holding capability (vacuum pressure).

To solve the above problem, according to a third aspect of the present invention, there is provided an exposure method for exposing a substrate through a mask formed with a pattern, the exposure method characterized by finding in advance a range of acceleration of a stage holding and moving the mask or the substrate where offset will not be caused in the mask or the substrate due to acceleration or deceleration of the stage and performing exposure while controlling the movement of the stage within the range of acceleration.

According to the present invention, in the same way as the exposure apparatus of the first aspect of the invention, it is possible to perform exposure at a high throughput without allowing offset to occur in the mask or substrate at the time of exposure.

To solve the above problem, according to a fourth aspect of the present invention, there is provided an exposure method for exposing a substrate through a mask formed with a pattern, the exposure method characterized by finding in advance a range of acceleration of a stage holding and moving the mask or the substrate where offset will not be caused in the mask or the substrate due to acceleration or deceleration of the stage, detecting information relating to acceleration of the stage and detecting the presence of offset of the mask or the substrate when the acceleration of the stage as based on the information is outside of the range of acceleration, and adjusting the relative positional relationship between the mask and the substrate (for example, the posture of the mask or substrate etc.) so as to cancel out offset when judging that offset has occurred in the mask or the substrate.

According to the present invention, in the same way as the exposure apparatus of the second aspect of the invention, the relative positional relationship between the mask and substrate is adjusted to as to cancel out offset when judging that offset has occurred in the mask or substrate, so even if offset of the mask or substrate occurs, that deviation is automatically corrected. This is desirable in obtaining a high throughput.

In the exposure method according to the fourth aspect of the invention, when judging that offset has occurred in the mask or substrate, it is possible to perform processing to notify an operator of that fact. Since the posture of the mask or substrate is detected when the acceleration detected by the acceleration detection device is outside of the range of acceleration where offset will not occur in the mask or substrate and the fact that offset of the mask or substrate is detected is notified to the operator when that is the case, there is no danger of exposure processing continuing while the offset of the mask or substrate remains and causing a defective product.

In the exposure methods according to the third aspect and fourth aspect of the invention, it is also possible to detect information relating to the capability of the stage to hold the mask and to change the range of acceleration in accordance with the detected information.

Note that "where offset will not occur in the mask or substrate" includes not only the case where the amount of offset is completely zero, but also the case where it is deemed to be substantially zero, for example, when it is not more than a predetermined amount negligible in precision in the production process of the device.

Further, the upper limit or range of the "acceleration of the stage where offset will not occur" differs according to the force of the stage holding the mask or substrate (holding force). For example, in a stage where the holding force fluctuates due to the environment or aging factors etc. or where the holding force is made variable, the upper limit or range of the acceleration also changes. Therefore, the upper limit or range of the acceleration may be set in accordance with the maximum value of the holding force of the stage, but is preferably set in accordance with the actual holding capability. Further, the "acceleration detection device" is not limited to an acceleration meter, vibration sensor, laser interferometer for detecting positional information of the stage, or other device for directly or indirectly measuring the acceleration and includes for example a control system for giving drive instructions to a drive system for driving the stage or other device for storing or generating information relating to acceleration. At this time, it is also possible to detect not the acceleration itself, but the speed or other related information.

The exposure apparatus of a fifth aspect of the present invention is an exposure apparatus for exposing a substrate through a mask formed with a pattern, comprised of a stage which holds and moves the mask, an acceleration detection device which detects information relating to acceleration of the stage, a posture adjustment device which adjusts a relative positional relationship between the mask and the substrate, a storage device in which offset information showing the relationship between the acceleration of the stage and the offset of the mask found in advance is stored, and a control device which retrieves from the storage device the offset information corresponding to the acceleration of the stage based on information detected by the acceleration detection device and adjusting the relative positional relationship of the mask and the substrate (for example, the posture of the mask or substrate) so as to cancel out the offset by the posture adjustment device.

The exposure method of a sixth aspect of the present invention is an exposure method for exposing a substrate through a mask formed with a pattern, the exposure method comprising performing exposure by finding in advance information showing offset occurring in the mask or substrate due to acceleration or deceleration of a stage for holding and moving the mask or the substrate in relation with the acceleration, detecting information relating to acceleration of the stage, and adjusting a relative positional relationship between the mask and the substrate (for example, the posture of the mask or substrate etc.) so as to cancel out the offset based on offset information corresponding to the acceleration of the stage as based on the detected information.

The exposure apparatus of a seventh aspect of the present invention is an exposure apparatus for exposing a substrate through a mask formed with a pattern, comprised of a stage which holds the mask, a detection device which detects information relating to acceleration of the stage, and an adjustment device which adjusts a relative positional relationship between the mask and the substrate (for example, the posture of the mask or substrate etc.) at the time of exposure in accordance with the detected information.

The exposure apparatus of an eighth aspect of the present invention is an exposure apparatus for exposing a substrate through a mask formed with a pattern, comprised of a stage which holds the mask, a detection device which detects information relating to acceleration of the stage, and a control device which performs at least one of an operation for recovery from exposure error occurring due to the offset due to movement of the stage and notification of the exposure error.

DESCRIPTION OF THE PREFERRED EMBODIMENTS

Figure 1:
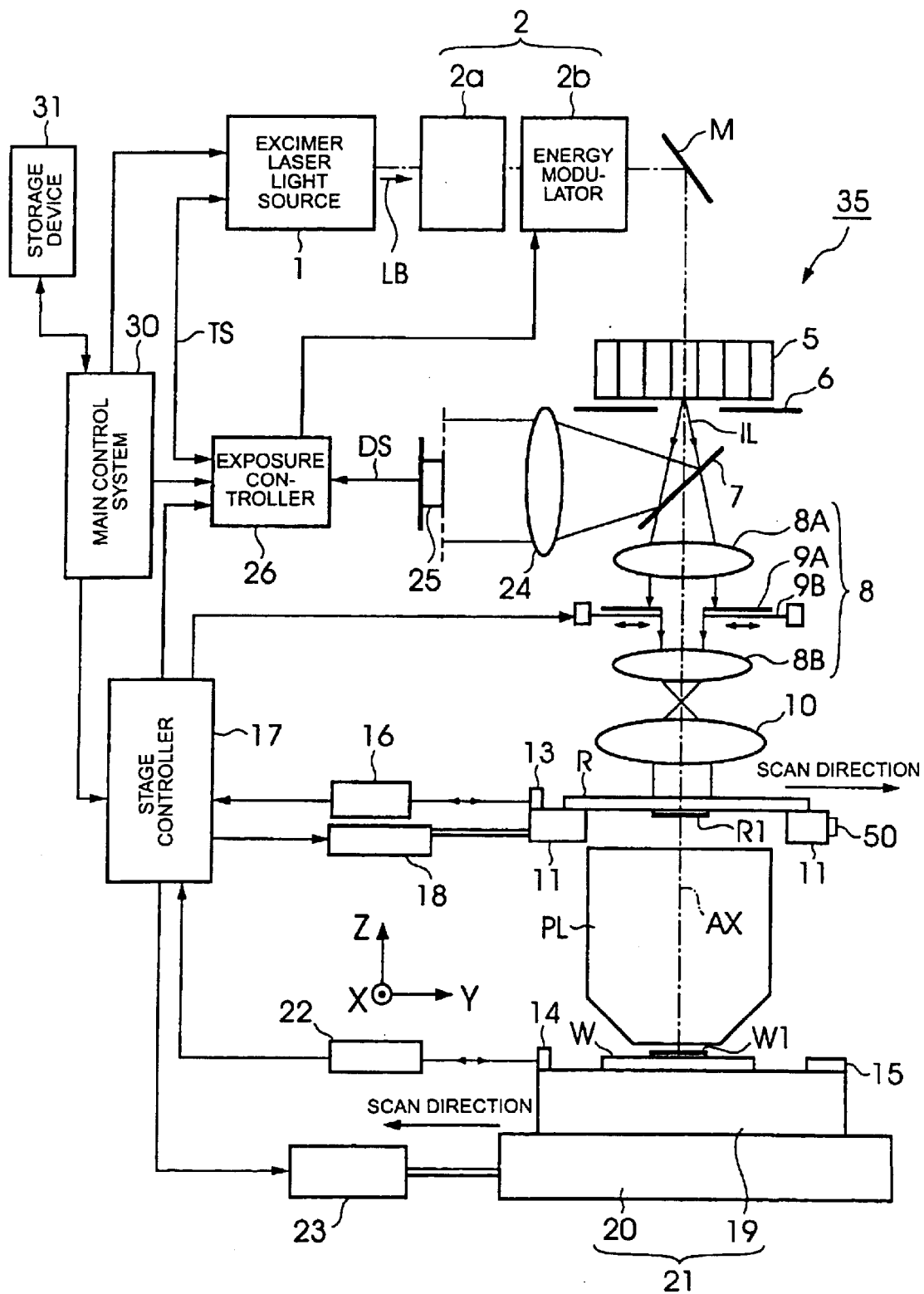
FIG. 1 is a view of the overall configuration of an exposure apparatus according to an embodiment of the present invention.

Below, an embodiment of the present invention will be explained with reference to the drawings. FIG. 1 is a view of the overall configuration of an exposure apparatus according to an embodiment of the present invention. Note that in the following explanation, the XYZ orthogonal coordinate system shown in FIG. 1 is set and the positional relationships of the members explained while referring to the XYZ orthogonal coordinate system. The XYZ orthogonal coordinate system is set so that the Y-axis and the Z-axis become parallel to the paper surface and so that the X-axis becomes the direction perpendicular to the paper surface. In the XYZ coordinate system in the figure, actually the XY plane is set to the plane parallel to the horizontal plane and the Z-axis is set to the vertical upper direction.

As shown in FIG. 1, the exposure apparatus of the present embodiment is a step-and-scan type exposure apparatus which projects by reduction part of a pattern on a reticle R (mask) through a projection optical system PL on to a wafer W (substrate) coated with a resist and makes the reticle R and wafer W synchronously scan the projection optical system PL so as to sequentially transfer a reduced image of the pattern on the reticle R to individual shot areas of the wafer W.

This exposure apparatus 35 is provided with a KrF excimer laser (oscillation wavelength 248 nm) as an illumination light source 1. The illumination light source 1 is not particularly limited to this. It is also possible to use g-rays (wavelength 436 nm), i-rays (wavelength 365 nm), and other rays, ArF excimer laser light (wavelength 193 nm), $F_2$ laser light (wavelength 157 nm), $Ar_2$ laser light (wavelength 126 nm), metal vapor laser light, or semiconductor laser light or other light of a harmonic generator. The laser beam LB pulsed from the exposure light source 1 enters a beam shaping and modulation optical system 2. In the present embodiment, the beam shaping and modulation optical system 2 is comprised of a beam shaping optical system 2a and an energy modulator 2b. The beam shaping optical system 2a is comprised of a cylinder lens or a beam expander etc. Due to this, the beam is shaped to a cross-section for efficient entry into the later fly-eye lens 5.

The energy modulator 2b is comprised of a rough energy modulator and a fine energy modulator. The rough energy modulator is comprised of a plurality of ND filters of different transmittance rates (=(1-light attenuation rate)×100 (%)) arranged on a rotatable revolver. By turning this revolver, it becomes possible to switch the transmittance rate with respect to an entering laser beam LB in several stages from 100%. Note that it is also possible to arrange two revolvers the same as this revolver and adjust the transmittance rate more finely by combination of two sets of ND filters. On the other hand, the fine energy modulator is of a double grating type or a type of a combination of two variable tilt angle parallel glass plates and continuously finely adjusts the transmittance rate with respect to the laser beam LD within a predetermined range. Instead of this fine energy modulator, however, it is also possible to finely adjust the energy of the laser beam LB by modulation of the output of the exposure light source 1.

The laser beam LB emitted from the beam shaping and modulation optical system 2 enters the fly-eye lens 5 through a light path bending mirror M. The fly-eye lens 5 forms a large number of secondary light sources for illuminating the following reticle R by a uniform illumination distribution. Note that instead of using a fly-eye lens 5 as the optical integrator (homogenizer), it is possible to use a rod integrator (inside surface reflection type integrator) or a diffraction optical element etc.

An aperture stop of the illumination system (so-called σ-stop) is arranged at the emission face of the fly-eye lens 5. The laser beam emitted from the secondary light sources in the aperture stop 6 (hereinafter called "pulse illumination light IL") enters the low reflectance, high transmittance beam splitter 7. The pulse illumination light IL passing through the beam splitter 7 enters the condenser lens 10 through the relay lens 8.

The relay lens 8 has a first relay lens 8A, a second relay lens 8B, and a fixed illumination field stop and movable illumination field stop 9B arranged between these lenses 8A and 8B (fixed reticle blind). The fixed illumination field stop 9A has a rectangular aperture. Pulse illumination light IL passing through the beam splitter 7 passes through the rectangular aperture of the fixed illumination field stop 9A through the first relay lens 8A. Further, the fixed illumination field stop 9A is arranged in the vicinity of the conjugate surface with the pattern surface of the reticle R. The movable illumination field stop 9B has an aperture variable in position in the scan direction and in width and is arranged in the vicinity of the fixed illumination field stop 9A. By further limiting the illumination field through the movable illumination field stop 9B at the time of start and time of ending of the scan exposure, exposure of unnecessary portions (other than shot areas on wafer W to which pattern formed on reticle is transferred) is prevented.

The pulse illumination light IL passing through the fixed illumination field stop 9A and the movable illumination field stop 9B passes through the second relay lens 8B and the condenser lens 10 to illuminate the rectangular illumination region R1 on the reticle R held by suction on the stage, that is, the reticle stage 11, by a uniform illumination distribution. An image of the pattern in the illumination region R1 on the reticle 1 reduced by a projection magnification β (β is for example ¼, ⅕, etc.) through the projection optical system PL is projected onto and exposed at the illumination field W1 on the wafer W coated with a photoresist. At this time, the reticle stage 11 is made to scan in the +Y axial direction by the reticle stage drive 18 serving as the posture adjustment device. The reticle stage 11 is configured to be able to rotate slightly in the XY plane. The angle of rotation is adjusted by the reticle stage drive 18.

A movable mirror 13 is attached to one end of the reticle stage 11. The coordinates of the reticle stage 11 in the X-axial direction and the Y-axial direction and the amount of rotation in the XY plane are supplied to the stage controller 17 by a laser interferometer 16 arranged at the mirror surface side of the movable mirror 13. The stage controller 17 controls the position and speed of the reticle stage 11 through the reticle stage drive 18 serving as the posture adjustment device based on the supplied coordinates and amount of rotation under the control of the later explained main control system 30. While not illustrated, the movable mirror 13 has a reflection surface extending along the X-direction and a reflection surface extending along the Y-direction, but instead of the reflection surface extending along the X-direction, it is also possible to use one or more corner cube type mirrors. Note that it is also possible to polish the end face of the reticle stage 11 to a mirror finish to form a reflection surface and use that reflection surface instead of the movable mirror 13. Further, the stage controller 17 detects the acceleration of the reticle stage 11 based on the detection signal output from the laser interferometer 16. Here, the laser interferometer 16 and stage controller 17 form a detection device for detecting information relating to acceleration of the stage in the present invention (hereinafter referred to as simply "acceleration"). Note that the detection device of the present invention is not limited to a laser interferometer 16 and may be an acceleration meter or anything else. Further, the detection device of the present invention is not limited to one which detects the value of acceleration. It may be any information corresponding to acceleration.

On the other hand, the wafer W is held by suction on the wafer stage 21 through a not shown wafer holder. The wafer stage 21 has a Z-tilt stage 19 and an XY stage 20 on which the Z-tilt stage 19 is placed. The XY stage 20 positions the wafer W in the X-axial direction and the Y-axial direction and moves the wafer W in the -Y-axial direction. The Z-tilt stage 19 has the function of adjusting the position of the wafer W in the Z-axial direction (focus position) and adjusting the tilt angle of the wafer W with respect to the XY plane. Further, a movable mirror 14 is attached to one end of the Z-tilt stage 19. The X-coordinates and Y-coordinates and amount of rotation in the XY plane (amount of yawing) of the XY stage 20 (wafer W) are measured by a laser interferometer 22 arranged at the mirror surface side of the movable mirror 14. These measurement values are supplied to the stage controller 17. The stage controller 17 controls the position and speed of the XY stage 20 through a wafer stage drive 23 based on the supplied coordinates and amount of rotation. Further, the stage controller 17 detects the acceleration of the XY stage 20 based on the detection signal output from the laser interferometer 22. Note that while not shown, the movable mirror 14 has a reflection surface extending along the X-direction and a reflection surface extending along the Y-direction. Further, it is also possible to polish the end face of the Z-tilt stage 19 to a mirror finish to form a reflection surface and use that reflection surface instead of the movable mirror 14. Further, the laser interferometer 22 may also be made able to detect at least one of the amount of rotation in the YZ plane (amount of pitching), amount of rotation in the XZ plane (amount of rolling), and Z-coordinates (distance in Z-direction along optical axis AX of projection optical system PL between the projection optical system PL or frame supporting it and the Z-tilt stage 19).

The stage controller 17 is controlled by the main control system 30 serving as the main control apparatus for overall control of the apparatus as a whole. Further, at the time of scan exposure, the reticle R is made to scan through the reticle stage 11 in the +Y-axial direction (or -Y-axial direction) at a speed VR. In synchronization with this, the wafer W is made to scan the illumination field W1 through the XY stage 20 in a -Y-axial direction (or +Y-axial direction) at a speed β·VR (where β is the projection magnification from the reticle R to the wafer W). Further, the reticle stage 11 has to be accelerated so that the speed of the reticle stage 11 becomes the speed VR before scan exposure, but the control apparatus 30 controls the movement of the reticle stage 11 in a range not causing offset at the reticle R placed on the reticle stage 11 at that time. Further, even after scan exposure, it is necessary to make the reticle stage 11 stop. At this time as well, it controls the movement of the reticle stage 11 in a range not causing offset at the reticle R placed on the reticle stage 11.

The storage device 31 stores the range of acceleration where offset of the reticle R will not occur when making the reticle stage 11 move. The range of acceleration may be found by measurement (simulation), but in this example, is found by a process of trial and error by making the reticle stage 11 move while changing the acceleration in stages in a state with a reticle R actually placed on the reticle stage 11 and is stored in the storage device 31. Note that the range of acceleration to be stored in the storage device 31 preferably includes, stored in the storage device 31, the range of acceleration in which offset will not occur, the range of acceleration in which offset might occur, and the range of acceleration in which offset will definitely occur. Note that details of the method of finding the range of acceleration will be explained later.

Here, "offset will not occur" does not mean only that the reticle R will not move at all, but includes a range where fine offset actually occurs, but it is deemed that substantially no offset has occurred, for example, the range of offset where overlay accuracy of the patterns etc. becomes in the allowable range in the case of exposure in this case. As opposed to this, "offset will occur" does not include the range where fine offset actually occurs, but it is deemed that substantially no offset has occurred, for example, the range where, when performing exposure processing in that state, the overlay accuracy of the patterns etc. becomes in the allowable range.

Further, an illumination uniformity sensor 15 comprised of a photoelectric conversion element is arranged in the vicinity of the wafer W on the Z-tilt stage 19. The light receiving face of the illumination uniformity sensor 15 is set to the same height as the surface of the wafer W. As the illumination uniformity sensor 15, a PIN type photodiode etc. having sensitivity in the distant ultraviolet and having a high response frequency for detecting the pulse illumination light IL can be used. The detection signal of the illumination uniformity sensor 15 is supplied through a not shown peak holding circuit and analog/digital (A/D) converter to the exposure controller 26.

Note that the pulse illumination light IL reflected at the beam splitter 7 is received at the integrator sensor 25 comprised of a photoelectric conversion element through a condenser lens 24. The photoelectric conversion signal of the integrator sensor 25 is supplied through a not shown peak hold circuit and A/D converter to the exposure controller 26 as output DS. The correlation coefficient of the output DS of the integrator sensor 25 and the luminance of the pulse illumination light IL (amount of exposure) on the surface of the wafer W is found in advance and stored in the exposure controller 26. The exposure controller 26 controls the emission timing and emission power etc. of the illumination light source 1 by supplying control information TS to the illumination light source 1. The exposure controller 26 controls the light attenuation rate at the energy modulator 2b and controls the opening and closing action of the movable illumination field stop 9B in synchronization with the operational information of the stage system.

Figure 2:
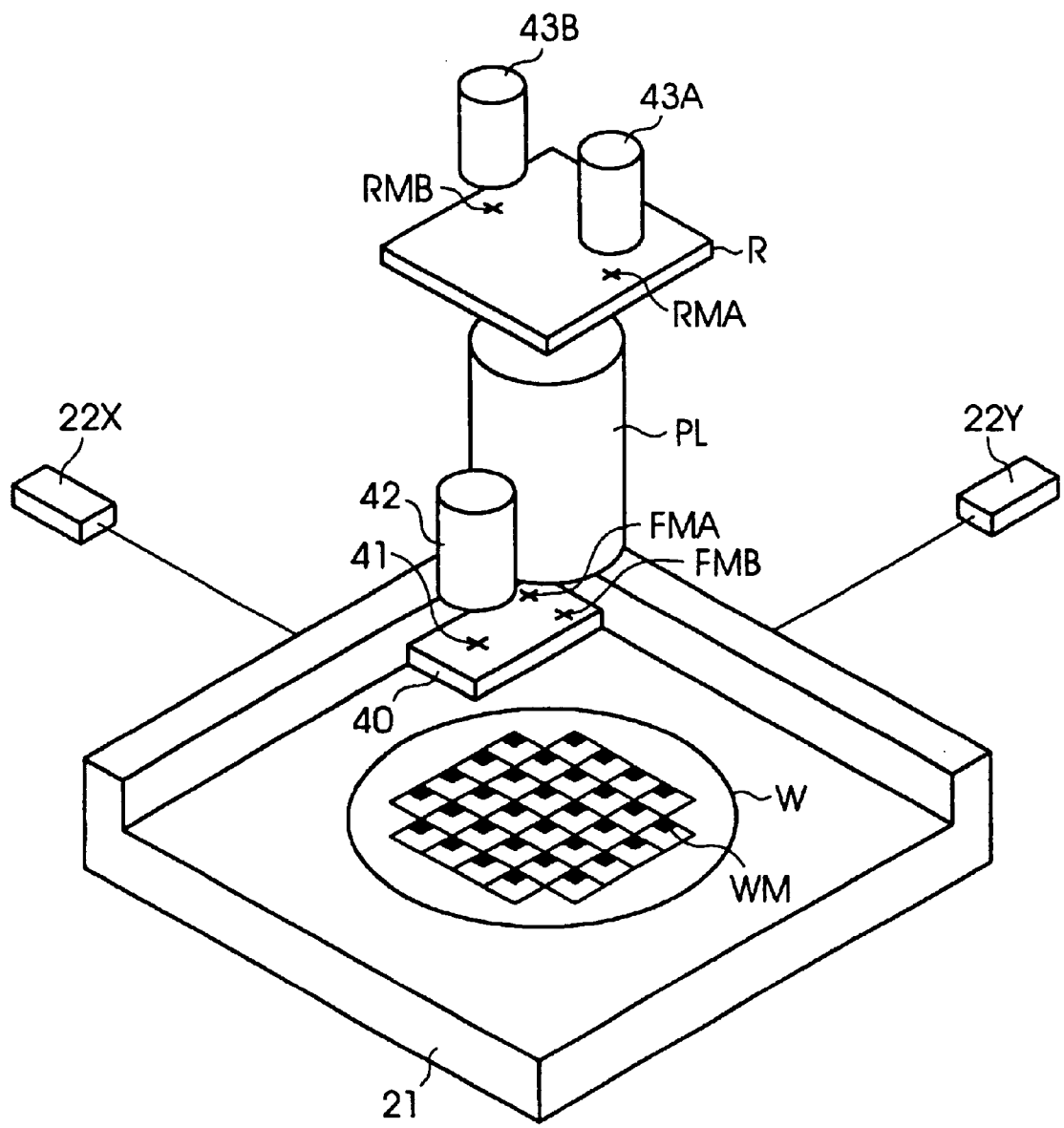
FIG. 2 is a schematic view of the configuration of an alignment system provided in the exposure apparatus according to an embodiment of the present invention.

Next, the alignment system (alignment apparatus) provided in the exposure apparatus of an embodiment of the present invention will be explained with reference to FIG. 2. Above the wafer stage 21, an off-axis type wafer alignment microscope 42 is affixed in the projection optical system PL. On the other hand, above the reticle R, a pair of TTR (through the reticle) type reticle alignment microscopes 43A and 43B are arranged. A fiducial mark plate 40 formed with fiducial marks FMA and FMB for the reticle alignment microscopes 43A and 43B and a fiducial mark 41 for the wafer alignment microscope 42 is fixed to the wafer stage 21.

The wafer alignment microscope 42 can measure the positions of the wafer alignment mark (hereinafter referred to as the "wafer mark") WM formed on the wafer W and the fiducial mark 41 formed on the fiducial mark plate 40. Note that while not shown, indicators serving as references when measuring the marks are provided inside the wafer alignment microscope 42. Further, a pair of reticle alignment marks (hereinafter referred to as "reticle marks") RMA and RMB which can be observed by the reticle alignment microscopes 43A and 43B are formed outside of the area of formation of the pattern in the reticle R (pattern area). By simultaneously observing these and the pair of fiducial marks FMA and FMB formed on the fiducial mark plate 40 on the wafer stage 21, it is possible to position the reticle marks RMA and RMB of the reticle R and the fiducial marks FMA and FMB on the wafer stage 21. Note that while not shown, fiducial marks are formed on the reticle stage 11 as well. These fiducial marks can also be detected by the reticle alignment microscopes 43A and 43B.

The positional relationship between the reference marks FMA and FMB for the reticle alignment microscopes formed on the fiducial mark plate 40 on the wafer stage 21 and the fiducial mark 41 for the wafer alignment microscope is measured accurately in advance and stored and held. The reticle alignment microscope 43A and the reticle alignment microscope 43B are identical in configuration. These reticle alignment microscopes 43A and 43B correspond to the posture detection apparatuses referred to in the present invention. In addition to the positioning of the above mentioned reticle marks RMA and RMB and fiducial marks FMA and FMB on the wafer stage 21, they are used for the purpose of detecting the posture of the reticle R including the offset of the reticle R in the X-axial direction, the offset in the Y-axial direction, and the amount of rotation of the reticle R in the XY plane occurring due to acceleration or deceleration of the reticle stage 11.

Figure 3A:
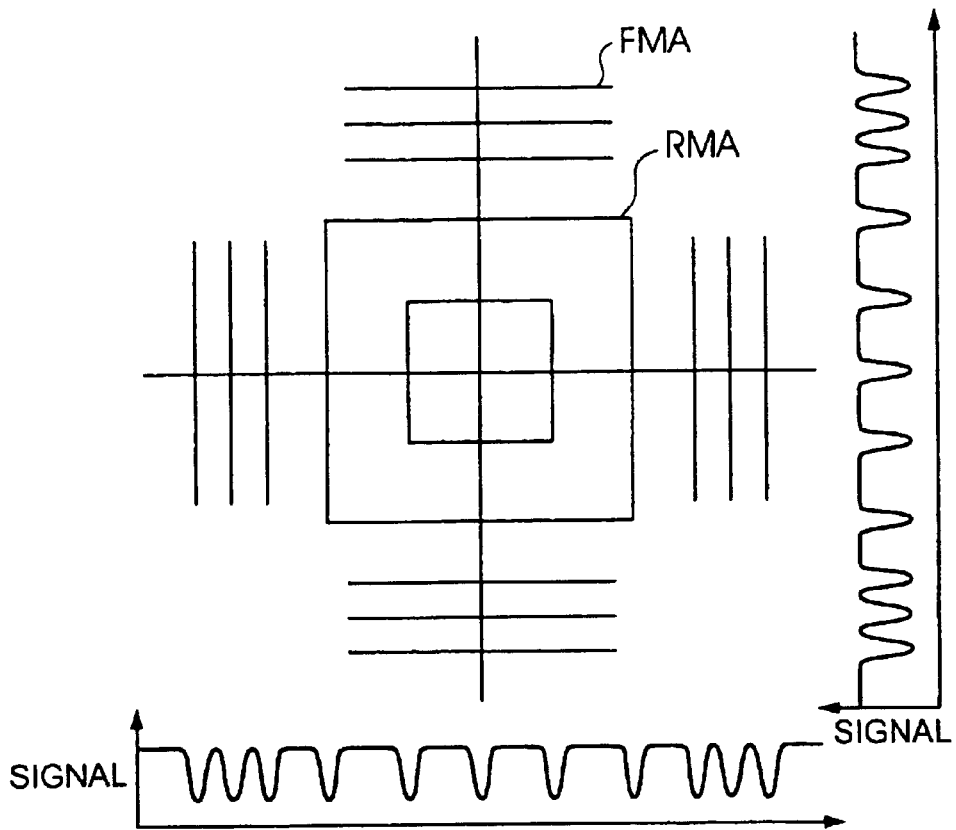
FIGS. 3A and 3B are views of images of reticle marks and fiducial marks detected by reticle alignment and their photoelectric converted signals.
Figure 3B:
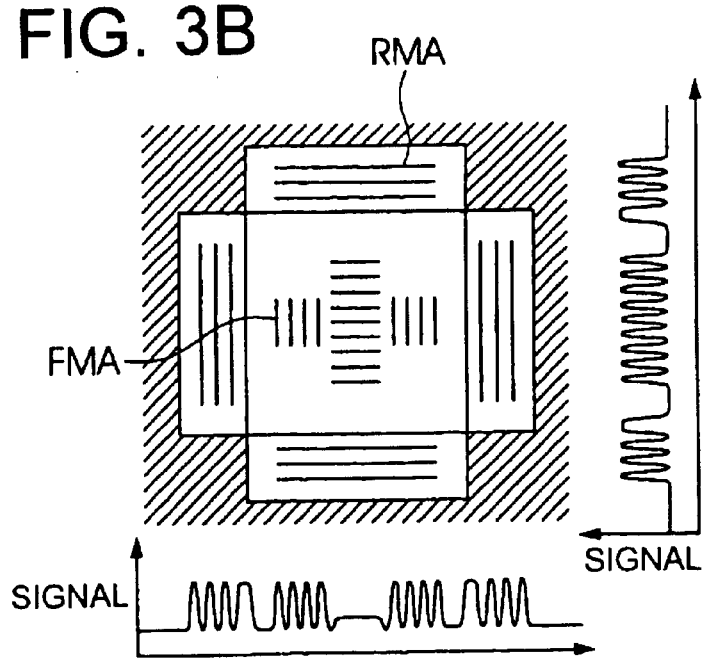

FIG. 3A and FIG. 3B are views of images of reticle marks and fiducial marks detected by the reticle alignment microscopes 43A and 43B and their photoelectric conversion signals. The specific shapes of the reticle marks RMA and fiducial marks FMA are not particularly limited, but as shown in the figure, it is preferable that the marks be of a combination enabling detection of offset in two-dimensional directions. FIG. 3A shows an example where a rectangular reticle mark RMA is arranged at the inside of stripe-shaped fiducial marks FMA arranged at the four sides. FIG. 3B shows an example where a fiducial mark FMA comprised of stripes formed into a cross vertical to each other is arranged at the inside and stripe-shaped reticle marks RMA are arranged at the four sides at the outside. The reticle marks RMB are the same as the reticle marks RMA, while the fiducial marks FMB are the same shape as the fiducial marks FMA.

In this way, the pair of reticle alignment microscopes 43A and 43B simultaneously observe the images of the reticle marks RMA and images of the fiducial marks FMA and the images of the reticle marks RMB and images of the fiducial marks FMA and FMB, respectively, detect the photoelectric conversion signals in two-dimensional directions as shown in FIG. 3A and FIG. 3B, and supply them to the main control system 30. The main control system 30 calculates the offset between the reticle marks RMA and fiducial marks FMA and the offset between the reticle marks RMB and fiducial marks FMB to calculate the posture of the reticle R. The offset data between the marks found at the main control system 30 is sent from the main control system 30 to the stage controller 17, where the position and posture of the reticle R (and/or wafer W) are adjusted so that the reticle R and wafer W are accurately positioned.

Next, the operation of this exposure apparatus will be explained in detail. First, this exposure apparatus derives by a process of trial and error the range of acceleration where offset of the reticle R will not occur when the reticle stage 11 is made to accelerate or decelerate by repeatedly detecting the posture of the reticle R by the reticle alignment microscopes 43A and 43B in the state with the reticle R held on the reticle stage 11 while the main control system 30 controls the stage controller 17 to increase or decrease in steps the acceleration of the reticle stage 11. It is however also possible to derive the range of acceleration where offset of the reticle R will not occur by theoretical calculation (simulation).

Figure 4:
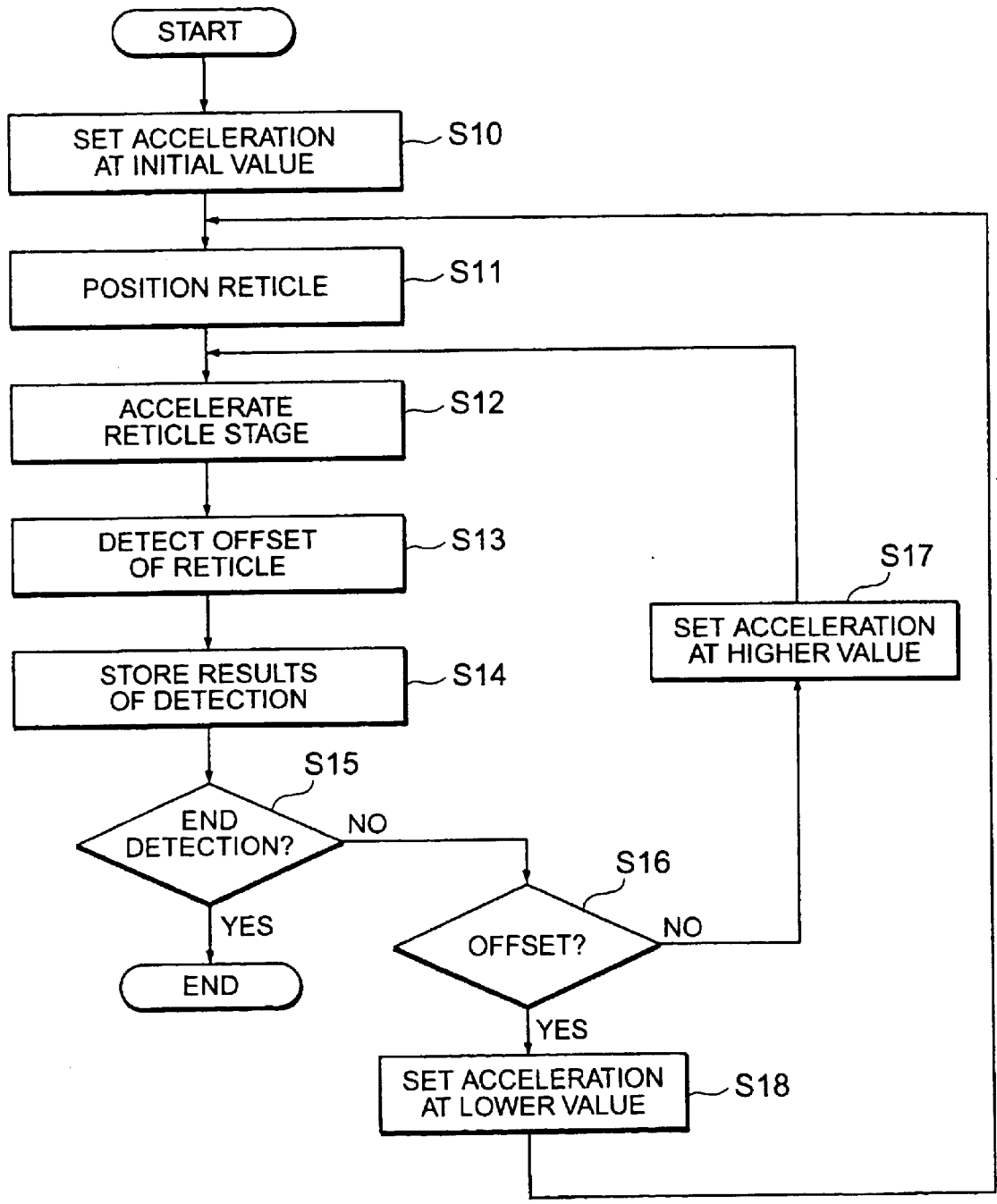
FIG. 4 is a flow chart of an example of the processing for finding the range of acceleration where offset of the reticle will not occur when causing the reticle stage to accelerate.

FIG. 4 is a flow chart of an example of the processing for finding the range of acceleration where offset of the reticle R will not occur when the reticle stage 11 is made to accelerate. FIG. 4 illustrates an example of the processing for finding the range of acceleration where offset of the reticle R will not occur while increasing the acceleration in stages. When the processing starts, first the main control system 30 performs the processing for initially setting the acceleration of the reticle stage 11 (step S10).

Here, to explain this taking as an example the case of causing the acceleration to increase in stages, the initial value of the acceleration is set to a low value (for this value, use is made of a value where offset of the reticle R does not occur according to the suction holding force of the reticle stage 11 and experience in past usage of the exposure apparatus). Next, the reticle R is positioned using the fiducial marks FMA and FMB formed on the fiducial mark plate 40 (step S11). This processing for example positions the fiducial marks FMA and FMB and the reticle marks RMA and RMB by simultaneously observing the reticle marks RMA and RMB and the fiducial marks FMA and FMB formed on the fiducial mark plate 40 on the wafer stage 21 by the reticle alignment microscopes 43A and 43B. At this time, if necessary, it adjusts the rotational angle of the reticle stage 11 in the XY plane through the reticle stage drive 18. Note that at step S11, it is also possible to just find the correspondence between the coordinate system defined by the laser interferometer 16 and the coordinate system defined by the laser interferometer 22 based on the results of detection of the reticle marks RMA and RMB and the fiducial marks FMA and FMB.

When the positioning of the reticle R finishes, the main control system 30 outputs a control signal to the stage controller 17 to start the acceleration of the reticle stage 11 (step S12). At this time, the acceleration set at step S10 is output from the main control system 30 to the stage controller 17 as one control signal. The stage controller 17 controls the reticle stage drive 18 so that a thrust based on the acceleration output from the main control system 30 is given to the reticle stage 11.

After the reticle stage 11 is made to accelerate, the main control system 30 returns the reticle stage 11 to its initial position at a low speed and uses the reticle alignment microscopes 43A and 43B to detect the offset of the reticle R (step S13) and stores the result of detection along with information indicating the presence of offset and information indicating the number of detection operations in the storage device 31 (step S14). When the above processing ends, it is judged if an instruction for ending detection has been made by the user (step S15). When an instruction for ending detection has been made, the processing is ended.

On the other hand, when no instruction for ending detection is given from the user (when result of judgement at step S15 is "NO"), it is judged if there is offset of the reticle R based on the result of detection at step S13 (step S16). When it is judged that no offset has occurred (when result of judgement at step S16 is "NO"), the main control system 30 sets the acceleration at a higher value (step S17), then returns to step S12, makes the reticle stage 11 accelerate at a newly set acceleration, and detects the offset of the reticle R. On the other hand, when it is judged at step S16 that there is offset of the reticle (when result of judgement is "YES"), the main control system sets the acceleration at a lower value (step S18), returns to step S11, positions the reticle R, makes the reticle stage 11 accelerate by the newly set acceleration, and detects offset of the reticle R.

Figure 5:
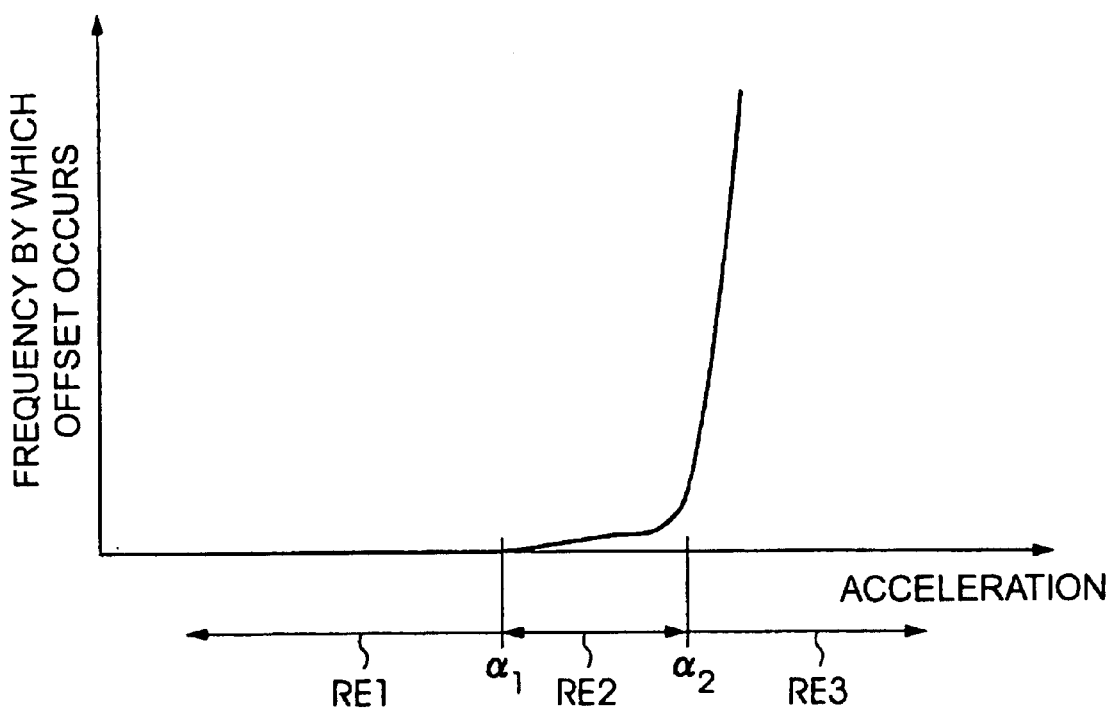
FIG. 5 is a view of an example of the relationship between the magnitude of acceleration obtained by performing the processing shown in FIG. 4 and the frequency by which offset of the reticle occurs.

The above completes the explanation of an example of processing to find the range of acceleration where offset of the reticle R will not occur while increasing the acceleration in stages given referring to FIG. 4. The main control system 30, however, repeats the processing explained above and the processing for detecting offset of the reticle R when making the reticle stage 11 decelerate and statistically finds the magnitude of acceleration and the frequency by which offset of the reticle stage occurs. FIG. 5 is a view of an example of the relationship between the magnitude of the acceleration obtained by performing the processing shown in FIG. 4 and the frequency by which offset of the reticle R occurs.

Referring to FIG. 5, the frequency by which offset occurs becomes higher along with a larger acceleration. When the acceleration is not more than α1, no offset of the reticle R occurs at all; when the acceleration is larger than α1 and not more than α2, the frequency by which offset occurs is low, but there is a possibility of offset occurring; and when the acceleration is greater than α2, offset almost always occurs. The range RE1 of acceleration not more than α1 is the range of acceleration where offset of the reticle R will not occur when the reticle stage 11 is made to move, the range RE2 of acceleration larger than α1 and not more than α2 is the range of acceleration where there is a possibility of offset occurring, and the range RE3 of acceleration larger than α2 is the range of acceleration where offset will occur. The main control system 30 finds these ranges based on the results of detection obtained by repeating the processing shown in FIG. 4 and stores them in the storage device 31.

Above, an example of the processing for finding the range of acceleration where offset of the reticle R will not occur when causing the reticle stage 11 to accelerate was explained, but similar processing may be performed to derive by a process of trial and error the range of acceleration where offset of the reticle R will not occur when causing the reticle stage 11 to decelerate. At this time, it is sufficient to find the ranges of acceleration in accordance with the directions of movement (for example, forward direction and reverse direction) of the reticle stage. Further, since the holding force (holding capability) of the reticle by the reticle stage can fluctuate due to changes in the environment or aging, it is possible to find the range of acceleration when for example an environmental condition changes or every predetermined time period. Note that when holding the reticle by electrostatics, the holding capability particularly changes along with the humidity. Further, it is possible to provide a sensor 50 for detecting the holding capability (in the present example, since a reticle is held by suction, a vacuum sensor) and change (correct) the range of acceleration derived first in accordance with the detected holding capability. The processing for deriving the range of acceleration explained above is performed at least at one of the time of startup of the exposure apparatus and the time of exchange of reticles R.

Next, the series of operations at the time of exposure will be explained.

Figure 6:
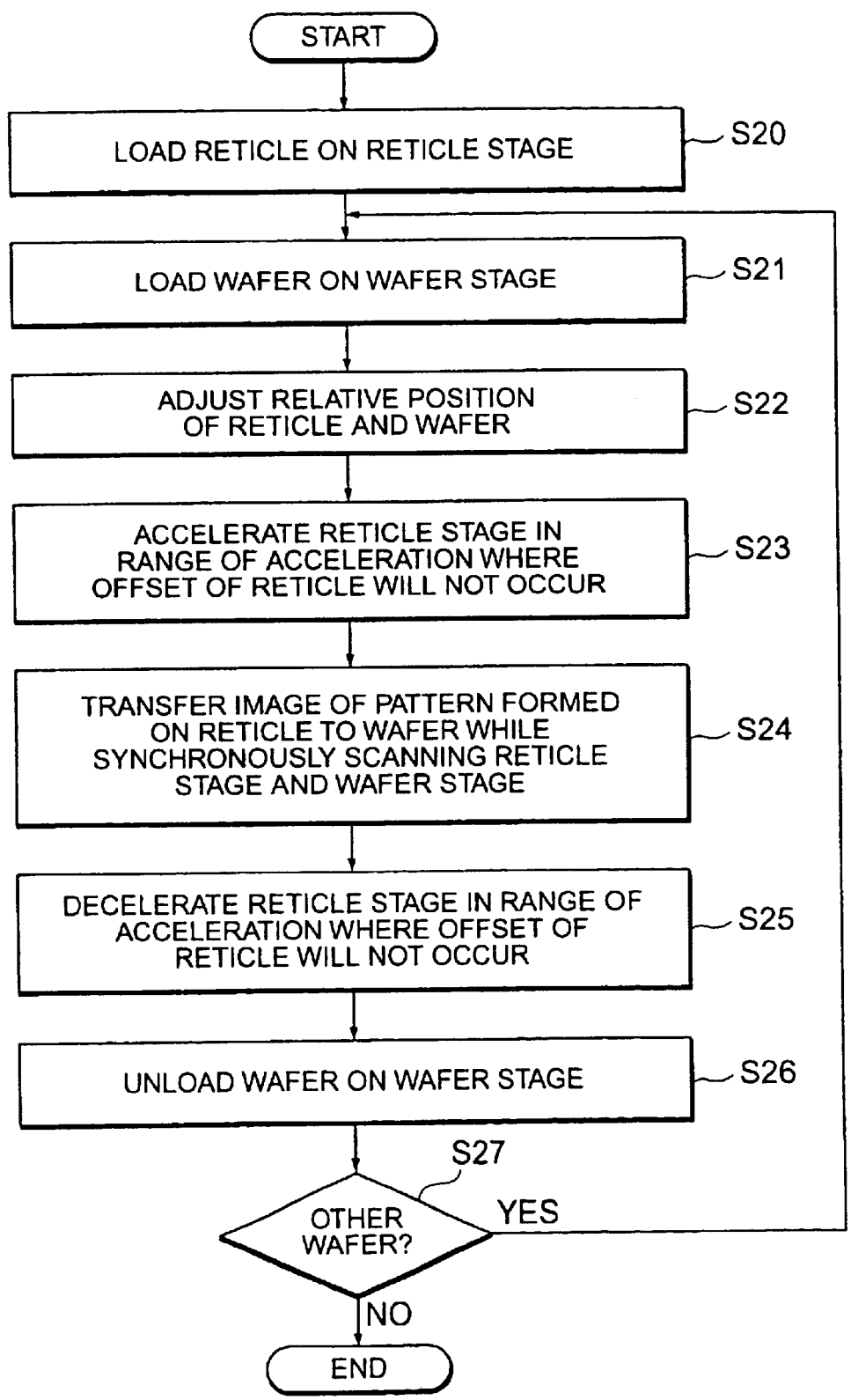
FIG. 6 is a flow chart of a first example of operation of the exposure apparatus according to the embodiment of the present invention.

[First Example of Operation] FIG. 6 is a flow chart of a first example of operation of the exposure apparatus according to an embodiment of the present invention. Note that FIG. 6 illustrates the flow when exposing a wafer using a single type of reticle for simplification of the explanation.

In FIG. 6, first the reticle R is loaded on to the reticle stage 11 and the reticle R is held (step S20). Next, the reticle alignment microscopes 43A and 43B are used to simultaneously observe the reticle marks RMA and RMB and the fiducial marks FMA and FMB formed on the fiducial mark plate 40 on the wafer stage 21 and adjust the relative positions of the reticle stage 11 and wafer stage 21 (establish correspondence between the reticle coordinate system and the wafer coordinate system). Next, the wafer stage 21 is moved, then the fiducial marks 41 formed on the fiducial mark plate 40 are observed by the wafer alignment microscope 42 to find the distance (baseline amount) between a reference position of the reticle R (for example, the center of the reticle R) and a reference position of the wafer alignment microscope 42 (for example, the center of the indicators).

After the above processing ends, the wafer W is loaded on to the wafer stage 21 (step S21) and the wafer alignment microscope 42 is used to measure the wafer mark WM and thereby measure the positional information of the wafer W. The positional information of the wafer W which is measured is corrected by the above baseline amount and the relative positions of the reticle R and wafer W are adjusted (step S22). Due to this, the reticle stage 11 and wafer stage 21 are moved to the acceleration start position for starting the scan exposure of the first shot area on the wafer W. When the relative position between the reticle R and the wafer W is adjusted, the main control system 30 reads the range RE1 of acceleration where offset of the reticle R will not occur when making the reticle stage 11 move (see FIG. 5), stored in the storage device 31, makes the reticle stage 11 move in the +Y-axial direction, makes the reticle stage 11 accelerate through the stage controller 17 so that the acceleration does not become more than that value (step S23), and makes the wafer stage 21 accelerate in the −Y-axial direction.

Next, the image of the pattern obtained by emitting the pulse illumination light IL on the reticle R is transferred to the first shot area on the wafer W through the projection optical system PL while making the reticle stage 11 and the wafer stage 21 engage in synchronous scan motion (step S24). After the scan exposure of the first shot area on the wafer W (transfer of pattern image of reticle R) ends, the main control system 30 starts the deceleration of the reticle stage 11 through the stage controller 17 so that the acceleration of the reticle stage 11 does not exceed the range of acceleration where offset of the reticle R will not occur (step S25) and starts the deceleration of the wafer stage 21.

At that time, after the end of the scan exposure of the first shot area (first scan exposure) and before the speed component in the scan direction (Y-direction) becomes zero, the wafer stage 21 starts to be moved in the nonscan direction (X-direction) (stepping operation) for the scan exposure of the second shot area on the wafer (second scan exposure). In this example, the wafer stage 21 starts to be accelerated in the nonscan direction substantially simultaneously with the start of deceleration in the scan direction. Further, the wafer stage 21 starts to be accelerated in the scan direction before the end of the stepping operation (speed component in nonscan direction becomes zero). On the other hand, the reticle stage 11 starts to be accelerated in the scan direction (direction opposite to first scan exposure) synchronously with the movement of the wafer stage 21 before the acceleration in the scan direction of the wafer stage 21 before the second scan exposure ends. Further, the second scan exposure is started after the reticle stage 11 and the wafer stage 21 reach their predetermined scan speeds. Note that the wafer stage 21 and the reticle stage 11 become opposite in direction of movement in the first scan exposure and second scan exposure. Next, the above operation is repeatedly executed until the scan exposure of all shot areas to which the pattern of the reticle R is to be transferred on the wafer W ends. When the scan exposure of the wafer ends, the reticle stage 11 and the wafer stage 21 are moved to their predetermined positions. Note that since the scan speeds of the reticle stage 11 and the wafer stage 21 at the time of scan exposure are determined in advance, it is desirable to make the acceleration at the time of acceleration or deceleration the maximum value not exceeding the corresponding range of acceleration so that the time until reaching the scan speeds becomes shortest.

When the above processing ends, the wafer W finished being exposed is unloaded from the wafer stage W (step S26) and it is judged if there is another wafer to be exposed (step S27). When it is judged that there is another wafer, the routine proceeds to step S21, while when it is judged that there is no other wafer, the processing is ended.

Note that in the flow shown in FIG. 6, when using a plurality of types of reticles to expose the wafer, after ending the processing of step S25, the reticles are exchanged and a new reticle used for the exposure shown in step S22 to step S25. This processing is performed for the number of times corresponding to the number of reticles. After the exposure of the entire surface of the wafer W ends, the wafer is unloaded at step S26. Further, in this example, the pattern of the reticle R was transferred overlappingly to the patterns formed in the shot areas on the wafer W, but even when transferring the first layer of reticle patterns on the wafer W, it is desirable to set the acceleration of the reticle stage 11 in exactly the same way as above.

Figure 7:
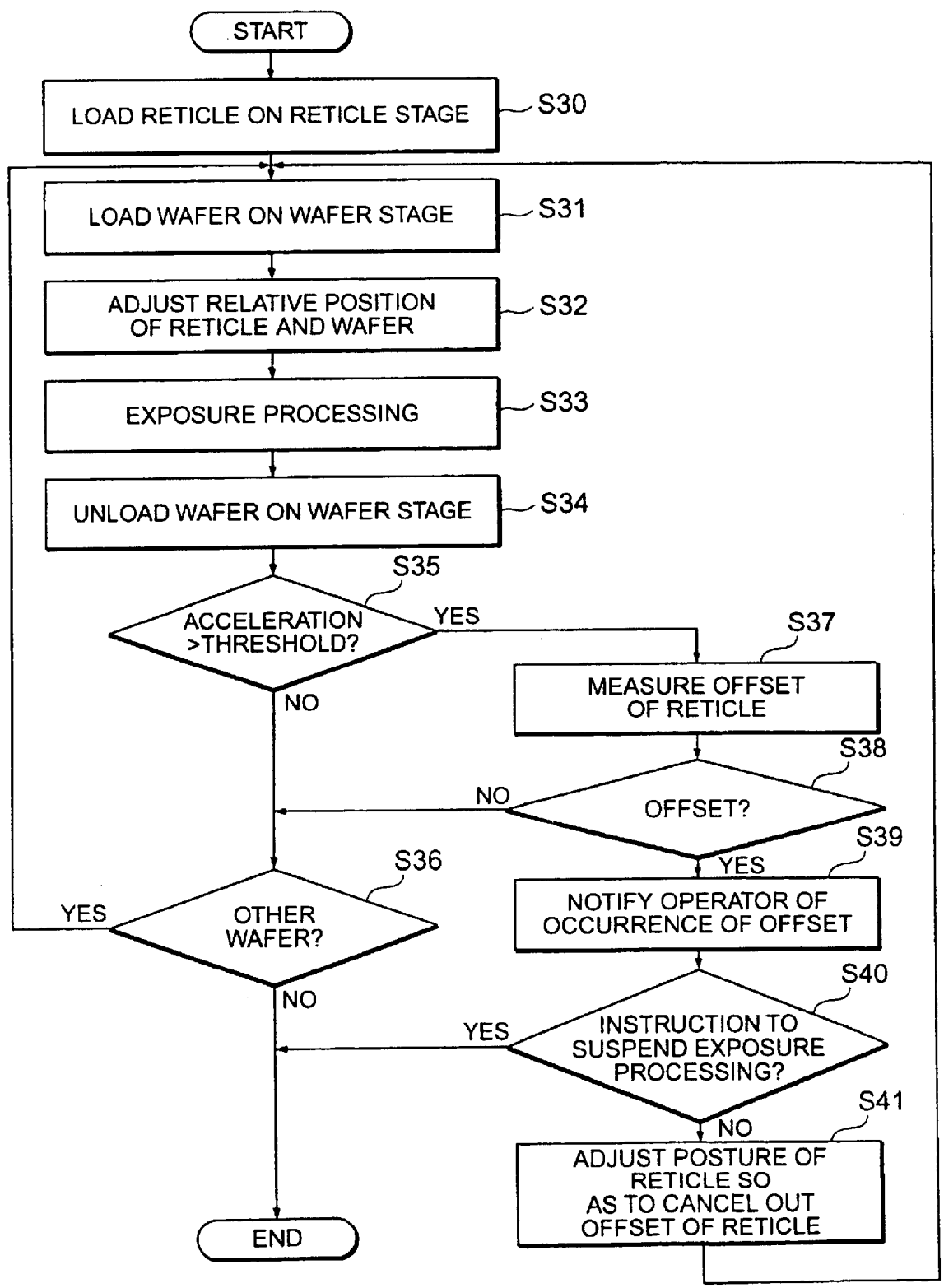
FIG. 7 is a flow chart of a second example of operation of the exposure apparatus according to the embodiment of the present invention.

[Second Example of Operation] FIG. 7 is a flow chart of a second example of operation of the exposure apparatus according to an embodiment of the present invention. Note that the second example of operation shown in FIG. 7, in the same way as the first example of operation shown in FIG. 6, illustrates the flow when exposing a wafer using a single type of reticle for simplification of the explanation.

When the processing starts, first the main control system 30 outputs the upper limit of the range of acceleration where offset of the reticle R will not occur (acceleration α1 in FIG. 5), stored in the storage device 31, as the threshold value to the stage controller 17. Next, the reticle R is loaded on to the reticle stage 11 and the reticle R is held (step S30). In the same way as in the first example of operation, the relative positions of the reticle stage 11 and wafer stage 21 are adjusted, then the baseline amount is found. Next, the wafer W is loaded on to the wafer stage 21 (step S31) and the wafer alignment microscope 42 is used to measure the positional information of the wafer W, the measured value is corrected by the baseline amount, and the relative positions of the reticle R and the wafer W are adjusted (step S32). Due to this, the reticle stage 11 and the wafer stage 21 are moved to the acceleration start positions for starting scan exposure of the first shot area on the wafer W.

When the above processing ends, the exposure processing is performed (step S33). This exposure processing consists of accelerating the reticle stage 11 and wafer stage 21 to constant speeds, then transferring an image of the pattern obtained by emitting illumination light on the reticle R to the first shot area on the wafer W through the projection optical system PL while making the reticle stage 11 and wafer stage 21 engage in synchronous scan motion, controlling the movement of the reticle stage 11 and wafer stage 21 in exactly the same way as the above first example of operation and, when scan exposure of all of the shot areas has been finished, decelerating and stopping the reticle stage 11 and wafer stage 21.

Here, the stage controller 17 detects the acceleration of the reticle stage 17 at the time of acceleration and deceleration during the exposure processing. When the detected acceleration becomes higher than the threshold output from the main control system 30 in advance, a signal indicating this is output to the main control system 30. When the exposure processing ends, the wafer W carried on the wafer stage 21 is unloaded (step S34).

When the wafer W finished being unloaded, the main control system 30 judges whether a signal indicating that the acceleration of the reticle stage 11 in the exposure processing has exceeded the threshold is being output from the stage controller 17 (step S35). When not output (when result of judgement at step S35 is "NO"), it judges the presence of another wafer W to be exposed (step S36). When there is a wafer W, it returns to step S31, while when there is no wafer, the series of exposure processing ends.

On the other hand, when it is judged at step S35 that a signal indicating that the acceleration of the reticle stage 11 in the exposure processing has exceeded the threshold is being output from the stage controller 17 (when the result of judgement is "YES"), the wafer stage 21 and the reticle stage 11 are made to move to positions where the relative positions of the wafer stage 21 and reticle stage 11 match (position adjusted at step S32), then the reticle marks RMA and RMB and the fiducial marks FMA and FMB formed on the fiducial mark plate 40 of the wafer stage 21 are simultaneously observed by the reticle alignment microscopes 43A and 43B and the offset of the reticle R (offset in X-axial direction, offset in Y-axial direction, and amount of rotation in the XY plane) is measured (step S37).

After this, it is judged if offset of the reticle R has occurred (step S38). When it is judged that offset has not occurred, the routine proceeds to the above-mentioned step S36. On the other hand, when it is judged at step S38 that offset has occurred, the fact that offset has occurred is notified to the operator (step S39). This notification is performed by displaying a message indicating that offset has occurred on the display (not shown) showing the state of processing of the exposure apparatus 35 or emitting an audio alarm.

Next, it is judged if an instruction has been given from the operator to suspend the exposure processing (step S40). When it is judged that an instruction for suspension has been given, the series of exposure processing is ended. On the other hand, when no instruction for suspension of the exposure processing has been given, the main control system 30 adjusts the posture of the reticle so as to cancel out the offset of the reticle R measured at step S37 through the stage controller 17 (step S41), then the routine proceeds to step S36. In this way, in the present embodiment, since any offset of the reticle R which occurs is automatically corrected, the time during which the series of exposure processing is interrupted can be minimized. This is preferable in improving the throughput.

Note that in the above-mentioned second example of operation, at step S41 of FIG. 7, the posture of the reticle R was adjusted to cancel out the offset of the reticle R measured at step S37, but it is also possible to repeat the adjustment of the relative positions of the reticle stage 11 and wafer stage 21 (for example, detection of the reticle alignment marks and fiducial marks) and the baseline measurement (see step S30). Further, it is also possible to correct the baseline amount based on the offset of the reticle R measured at step S37. Further, at step S41, the posture of the reticle R was adjusted, but it is also possible to adjust the posture of the wafer W instead. Alternatively, it is possible to relatively move both of the reticle R and wafer W. Further, even if it is judged at step S35 that the acceleration of the reticle stage 11 has exceeded the threshold value, the offset of the reticle R is found without interrupting the exposure processing and the relative positional relationship of the reticle R and wafer W at the time of scan exposure is corrected based on the amount of offset, for example, correct the baseline amount, or add offset corresponding to the amount of offset to the coordinates of the shot areas on the wafer.

The embodiment explained above was described to facilitate understanding of the present invention and was not described to limit the invention. Therefore, the elements disclosed in the above embodiment include all design changes and equivalents falling under the technical scope of the present invention.

For example, in the above embodiment, the explanation was given taking as an example the case of the stage controller 17 detecting the acceleration of the reticle stage 11 based on the results of measurement of the laser interference system 16, but it is also possible to provide an acceleration sensor on the reticle stage 11. Further, it is also possible to detect the acceleration using a thrust instruction value to the linear motor driving the reticle stage 11.

Further, in the above embodiment, the explanation was made of the reticle R being held by suction on the reticle stage 11, but there are also cases of holding it softly by a weaker holding force considering the bending of the reticle R by the holding action and cases of placing on it a plurality of support pines (for example, three) without holding force. In the case of such soft holding or non-holding, offset occurs more easily in the reticle R, so the present invention is particularly effective in such cases.

Further, instead of holding the reticle by suction or together with holding it by suction, it is possible to hold it electrostatically. Further, in the above embodiments, the explanation was made of the time of acceleration and deceleration of the reticle stage 11 in scan exposure, but it is also possible to control movement of the reticle stage 11 by setting acceleration in exactly the same way as the above embodiments even when for example the reticle R moves at the time of alignment of the reticle R, baseline measurement of the alignment system 42, and measurement of the imaging characteristics of the projection optical system, the reticle R moves between the alignment position and exposure position (acceleration starting position), or causing stepping of the reticle R in the non-scan direction orthogonal to the scan direction for transferring the pattern of the reticle R on to the wafer by several exposures. Further, the exposure apparatus in the above embodiments was made a scan exposure type, but it may also be a stationary exposure type which makes the reticle and wafer substantially stop and then transfers patterns to the shot areas. Further, the posture detection device is not limited to the reticle alignment microscopes 43A and 43B. It may be configured in any way such as an optical system for detecting patterns, alignment marks, etc. of the reticle R through the projection optical system PL or a interferometer for emitting a laser beam to a mirror finished end face of the reticle R. Further, the reticle stage 11 may be configured by a combination of a rough movement stage moved by a large stroke in the scan direction and a fine movement stage able to be moved relative to the rough movement stage.

In the above embodiments, the explanation was given of the case of application of the present invention to the reticle R, but it may of course also be applied to a substrate. In particular, the substrate (blank) which is exposed when producing a mask (reticle) using an exposure apparatus sometimes is held or supported in the same way as the reticle R taking into consideration bending along with support. It is effective to apply the present invention to such cases.

The exposure apparatus of the above embodiment (FIG. 1) is produced by electrically, mechanically, or optically connecting and assembling an illumination optical system, a projection optical system PL, the reticle stage 11 including a drive 18, the wafer stage 21 including a drive 23, the laser interferometers 16 and 22, the reticle alignment system, the wafer alignment system, and other elements shown in FIG. 1, then performing overall adjustment (electrical adjustment, check of operation, etc.) so as to improve the throughput and enable exposure with a high exposure accuracy. The exposure apparatus is desirably manufactured in a clean room controlled in temperature and cleanness etc.

To produce a device (IC or LSI or other semiconductor chip, liquid crystal panel, CCD, thin film magnetic head, micromachine, etc.) using the exposure apparatus according to this embodiment of the present invention, first, at the design step, the functions of the device are designed (for example, the circuit of the semiconductor device is designed etc.) and the pattern for realizing those functions are designed. Next, at the mask fabrication step, a mask formed with the designed circuit pattern is fabricated. On the other hand, in the wafer production step, silicon or another material is used to produce a wafer.

Next, at the wafer process step, the mask and wafer prepared at the above steps are used to form the actual circuit etc. on the wafer using photolithography. Next, at the assembly step, the wafer processed at the wafer process step is used to make chips. This assembly step includes assembly (dicing and bonding), packaging, and other steps. Finally, at the inspection step, tests for confirmation of the operation of the devices fabricated at the assembly step, endurance tests, and other inspections are performed. The devices are completed after these steps and then shipped out.

Note that in the above embodiment, the explanation was given taking as an example a scan type exposure apparatus for sequentially transferring the pattern of a mask while synchronously moving the reticle and substrate, but the present invention is not limited to this and can also be applied to a stationary type exposure apparatus for exposure in a block in a state with the mask and substrate held stationary after successively moving them in steps. Further, the application of the exposure apparatus is not limited to an exposure apparatus for semiconductor production. For example, the invention may also be applied to an exposure apparatus used for the production of a display device including liquid crystal display or a plasma display, a thin film magnetic head, a pickup element (CCD), a mask (reticle), DNA chip, or a vibrator used in a mobile phone or home game system.

The light source of the present embodiment may be not only g-rays (wavelength 436 nm), i-rays (wavelength 365 nm), and other rays, KrF excimer laser light (wavelength 248 nm), ArF excimer laser light (wavelength 193 nm), $F_2$ laser light (wavelength 157 nm), and $Ar_2$ laser light (wavelength 126 nm), but also metal vapor laser light or YAG laser light or other harmonics etc. Further, it is also possible to use an infrared region or visible region single wavelength laser light emitted from a DFB semiconductor laser or fiber laser amplified by for example an erbium (or both erbium and yttrium) doped fiber amplifier and use the harmonic obtained by converting the wavelength to ultraviolet light using a nonlinear optical crystal.

For example, if the oscillation wavelength of the single wavelength laser is made a range of 1.51 to 1.59 μm, an 8th harmonic of an oscillation wavelength in the range of 189 to 199 nm or a 10th harmonic of an oscillation wavelength in the range of 151 to 159 nm is output. In particular, if the oscillation wavelength is made one in the range of 1.544 to 1.553 μm, ultraviolet light of an 8th harmonic in the range of 193 to 194 nm, that is, a wavelength substantially the same as that of an ArF excimer laser, is obtained. If the oscillation wavelength is made one in the range of 1.57 to 1.58 μm, ultraviolet light of a 10th harmonic in the range of 157 to 158 nm, that is, a wavelength substantially the same as that of an $F_2$ laser, is obtained.

Further, if the oscillation wavelength is made one in the range of 1.03 to 1.12 μm, a 7th harmonic of an oscillation wavelength in the range of 147 to 160 nm is output. In particular, if the oscillation wavelength is made one in the range of 1.099 to 1.106 μm, ultraviolet light of a 7th harmonic in the range of 157 to 158 nm, that is, a wavelength substantially the same as that of an $F_2$ laser, is obtained. Note that as the single wavelength oscillation laser, a yttrium-doped fiber laser is used.

Further, the illumination light is not limited to the above-mentioned distant ultraviolet region or vacuum ultraviolet region. It may also be light of a soft X-ray region (wavelength of about 5 to 15 nm) emitted from a laser plasma light source or SOR, for example, EUV (extreme ultraviolet) light of a wavelength of 13.4 nm or 11.5 nm or may also be the hard X-ray region (wavelength of less than about 1 nm). Note that in an EUV exposure apparatus, a reflection type reticle (mask) is used and the projection optical system is a reduction system with only the image plane side telecentric and a reflection system comprised of only a plurality of (about three to six) reflection optical elements.

Further, in the above embodiments, the projection optical system was made a reduction system, but it may also be an equal magnification system or an enlargement system. The projection optical system PL may also be any one of a catoptric system comprised of only a plurality of refraction elements, a dioptric system comprised of only a plurality of reflection elements, and a catadioptric system comprised of refraction elements and reflection elements.

When using a linear motor for the wafer stage or the reticle stage, it is possible to use either of an air-flotation type using air bearings or a magnetic flotation type using Lorentz force or reactance force. Further, the stages may be types moving along guides or guideless types without guides. As the drive for a stage, it is also possible to use a planar motor driving a stage by electromagnetic force by bringing a magnet unit comprised of magnets arranged two-dimensionally and an armature unit comprised of a coil arranged two-dimensionally into a facing relationship.

The reaction force generated due to movement of the wafer stage may be mechanically released to the floor (ground) using a frame member as described in Japanese Unexamined Patent Publication (Kokai) No. 8-166475. The reaction force generated due to movement of the reticle stage may be mechanically released to the floor (ground) using a frame member as described in Japanese Unexamined Patent Publication (Kokai) No. 8-330224.

Note that in the above embodiment, when offset occurs in the reticle or substrate along with movement of a stage, that offset is measured and the posture of the reticle or substrate is adjusted, but it is also possible to perform the following without measuring the posture of the reticle or substrate. That is, the offset occurring in the reticle or substrate due to acceleration or deceleration of the stage holding and moving the reticle or substrate is found by a process of trial and error or theoretically and offset information showing the relationship between the stage and acceleration is stored in advance in the storage device. Next, at the time of movement of the stage, the acceleration of the stage is measured and the positional information corresponding to the acceleration at that time is extracted from the storage device. Based on this extracted offset information, the posture of the reticle or substrate is adjusted. Since measurement of the posture of the reticle or substrate becomes unnecessary, it is possible to speed up the processing.

As explained above, according to the present invention, it becomes possible to perform exposure by a high throughput without causing offset accompanying movement of the mask or substrate and it becomes possible to improve the productivity of the microdevice etc.

Further, even when offset occurs along with movement of the mask or substrate, this is notified to the operator or the offset is automatically corrected and then the exposure processing continued, so exposure processing in a state of offset can be prevented from continuing and defects are caused less often.

The present disclosure relates to subject matter contained in Japanese Patent Application No. 2000-390183, filed on Dec. 22, 2000, and Japanese Patent Application No. 2001-388574, filed on Dec. 20, 2001, the disclosure of which is expressly incorporated herein by reference in its entirety.

What is claimed is:

1. An exposure apparatus which exposes a substrate through a mask formed with a pattern, said exposure apparatus comprising:

a stage which holds said mask and is moved by an actuator to move said mask in a direction on a predetermined plane substantially parallel to a pattern sufface of said mask;

an acceleration detection device which detects information relating to acceleration of the stage; and a control device which controls movement of said stage via said actuator based on a range of acceleration of said stage where an offset, in said predetermined plane, of said mask on said stage is not caused by movement of said stage so that the acceleration of said stage as based on the information detected by said acceleration detection device becomes within the range of acceleration of said stage.

2. An exposure apparatus according to claim 1, which derives the range of acceleration by a process of trial and error by repeatedly detecting offset of said mask while increasing or decreasing the acceleration of the stage in steps.

3. An exposure apparatus according to claim 2, wherein the range of acceleration is derived at least at one of a time of staltup of said exposure apparatus and a time of exchange of said mask.

4. An exposure apparatus according to claim 1, further comprising a storage device which stores the range of acceleration of said stage.

5. An exposure apparatus according to claim 1, wherein:
said apparatus further comprises a sensor which detects information relating to a capability of said stage to hold said mask; and said control device changes said range of acceleration in accordance with said information.

6. An exposure apparatus according to claim 1, wherein:
said mask is held by suction at a portion of said pattern surface of said mask on said stage; and
said range of acceleration of said stage is determined based on the suction holding force to said mask by said stage.

7. An exposure apparatus according to claim 6, where said control device changes said range of acceleration of said stage in accordance with fluctuates in the suction holding force to said mask by said stage.

8. An exposure apparatus according to claim 6, wherein said control device changes said range of acceleration of said stage in accordance with fluctuates in installation environment or aging factors of said stage.

9. An exposure apparatus which exposes a substrate through a mask formed with a pattern, said exposure apparatus comprising:
a stage which holds said mask and is moved by an actuator to move said mask in a direction on a predetermined plane substantially parallel to a pattern surface of said mask;
an acceleration detection device which detects information relating to acceleration of said stage;
a posture detection device which detects a posture of said mask on said stage; and
a control device which checks the acceleration of said stage based on the information detected by said acceleration detection device and which initiates detection by said posture detection device when the acceleration of said stage becomes out of the range of acceleration of said stage where an offset, in said predetermined plane, of said mask on said stage is not caused by movement of said stage.

10. An exposure apparatus according to claim 9, which further comprises a posture adjustment device which adjusts the relative positional relationship between the mask on the stage and the substrate, and
adjusts the relative positional relationship of the mask and substrate so as to cancel out offset by said posture adjustment device when said control device judges that offset has occurred in the mask.

11. An exposure apparatus according to claim 9, which derives the range of acceleration by a process of trial and error by repeatedly detecting the offset of said mask while increasing or decreasing the acceleration of the stage in steps.

12. An exposure apparatus according to ciaim 9, further comprising a storage device which stores the range of acceleration of said stage.

13. An exposure apparatus according to claim 9, wherein:
said apparatus further comprises a sensor which detects information relating to a capability of said stage to hold said mask; and
said control device changes said range of acceleration in accordance with said information.

14. An exposure apparatus according to claim 9, wherein said control device notifies an operator of the fact that said checked acceleration becomes out of said range of acceleration of said stage or that said offset is caused by the movement of said stage.

15. An exposure method for exposing a substrate through a mask formed with a pattern, said exposure method comprising:
holding said mask or said substrate by a stage moved via an actuator to move said mask or said substrate in a direction on a predetermined plane substantially parallel to a surface thereof,
determining a range of acceleration of said stage where an offset, in said predetermined plane, of said mask or said substrate on said stage is not caused due to acceleration or deceleration of the stage; and
performing exposure while controlling the movement of said stage via said actuator based on the range of acceleration so that the acceleratinn of said stage becomes within the range of acceleration.

16. An exposure method according to claim 15, further comprising:
detecting information relating to the capability of the stage to hold the mask; and
changing the range of acceleration in accordance with the information.

17. An exposure method according to claim 15, wherein:
said mask is held by suction at a portion of said pattern surface of said mask on said stage; and
said range of acceleration of said stage is determined based on the suction holding force to said mask by said stage.

18. An exposure method according to claim 17, wherein said range of acceleration is changed in accordance with fluctuations in the suction holding force to said mask by said stage.

19. An exposure method according to claim 17, wherein said range of acceleration is changed in accordance with fluctuations in installation environment or aging factors of said stage.

20. An exposure method for exposing a substrate through a mask formed with a pattern, said exposure method comprising:
holding said mask or said substrate by a stage moved via an actuator to move said mask or said substrate in a direction on a predetermined plane substantially parallel to a surface thereof,
determining a range of acceleration of said stage where an offset, in said predetermined plane, of said mask or said substrate on said stage is not caused due to acceleration or deceleration of the stage;
detecting information relating to acceleration of said stage; and
detecting a posture of said mask or said substrate on said stage when the acceleration of said stage as based on said detected information becomes out of the range of acceleration.

21. An exposure method according to claim 20, further comprising performing processing to notify an operator when judging that the offset has occurred in the mask or substrate.

22. An exposure method according to claim 20, further comprising:
detecting information relating to the capability of the stage to hold the mask; and
changing the range of acceleration in accordance with the information.

23. An exposure method according to claim 20, further comprising adjusting a relative positional relationship between said mask and said substrate when judging based on said detected posture, that said offset is caused by movement of said stage.

24. An exposure apparatus which exposes a substrate through a mask formed with a pattern, said exposure apparatus comprising:

a stage which holds said mask and is moved by an actuator to move said mask in a direction on a predetermined plane substantially parallel to a pattern surface of said mask;

an acceleration detection device which detects information relating to acceleration of said stage;

a posture adjustment device which adjusts a relative positional relationship between said mask and said substrate;

a storage device in which offset information showing the relationship between the acceleration of the stage and an offset, in said predetermined plane, of the mask on the stage caused by movement of said stage is stored; and a control device which retrieves from said storage device the offset information corresponding to the acceleration of the stage based on the information detected by said acceleration detection device and adjusts a relative positional relationship between said mask and said substrate based on the retrieved offset information by said posture adjustment device so as to compensate the offset of the mask on the stage.

25. An exposure method for exposing a substrate through a mask formed with a pattern, said exposure method comprising:

holding said mask or said substrate by a stage moved via an actuator to move said mask or said substrate in a direction on a predetermined plane substantially parallel to a surface thereof, determining information showing the relationship between the acceleration of said stage and an offset, in said predetermined plane, of said mask or said substrate on the stage caused due to acceleration or deceleration of said stage; and detecting information relating to acceleration of said stage to obtain offset information corresponding to the acceleration of said stage based on the determmnpA information and the detected information and adjusting a relative positional relationship between said mask and said substrate based on the obtained offset information so as to compensate the offset of said mask or said substrate.

26. An exposure apparatus which exposes a substrate through a mask formed with a pattern, said exposure apparatus comprising:

a stage which holds said mask and is moved by an actuator to move said mask in a direction on a predetermined plane substantially parallel to a pattern surface of said mask;

a detection device which detects information relating to acceleration of said stage; and a control device which determines information relating to an offset, in said predetermined plane, of said mask on said stage caused by movement of said stage based on the detected information and information showing the relationship between the acceleration of said staRe and the offset of said mask and adjusts a relative positional relationship between said mask and said substrate based on the determined information so as to compensate the offset of said mask on said stage, and which performs at least one of an operation for recovery from exposure error and notification of said exposure error when judging based on the determined information, that said exposure error occurs due to said offset.

* * * * *